United States Patent [19]

Zimmerman

[11] Patent Number: 4,786,860
[45] Date of Patent: Nov. 22, 1988

[54] MISSING WIRE DETECTOR

[75] Inventor: Robert Zimmerman, Naperville, Ill.

[73] Assignee: Hughes Aircraft Company, Los Angeles, Calif.

[21] Appl. No.: 35,849

[22] Filed: Apr. 8, 1987

[51] Int. Cl.⁴ ............................................. G01N 3/30
[52] U.S. Cl. .................... 324/65 R; 73/827; 228/4.5; 228/10; 228/103; 324/525; 324/555
[58] Field of Search .............. 324/65 R, 525, 555; 73/827, 588; 228/103, 104, 179, 4.5, 10

[56] References Cited

U.S. PATENT DOCUMENTS

| | | | |
|---|---|---|---|
| 2,633,019 | 3/1953 | Albrecht et al. | 324/65 R |
| 3,818,334 | 6/1974 | Rosenberg | 324/65 R |
| 4,068,371 | 1/1978 | Miller | 228/4.5 X |
| 4,597,522 | 7/1986 | Kobayashi | 228/4.5 X |
| 4,600,138 | 7/1986 | Hill | 228/4.5 X |

OTHER PUBLICATIONS

Unger et al., Self Test Ultrasonic Wire Bonding (Wire Bonding and Non—destructive Pull Testing by the Same Equipment), IEEE, May 1979, pp. 377-383.

*Primary Examiner*—Reinhard J. Eisenzopf
*Assistant Examiner*—Robert W. Mueller
*Attorney, Agent, or Firm*—Joseph E. Szabo; Anthony W. Karambelas

[57] ABSTRACT

The absence of a wire (40) in proper position under the bonding tool (32) of an ultrasonic wire bonder is detected by energizing the bonder transducer (14) while the wire is pulled to break it after the second bond (B) has been made. The pulling of the wire to break it changes the transducer impedance, which is monitored to signal presence or absence of a wire in its proper location.

16 Claims, 2 Drawing Sheets

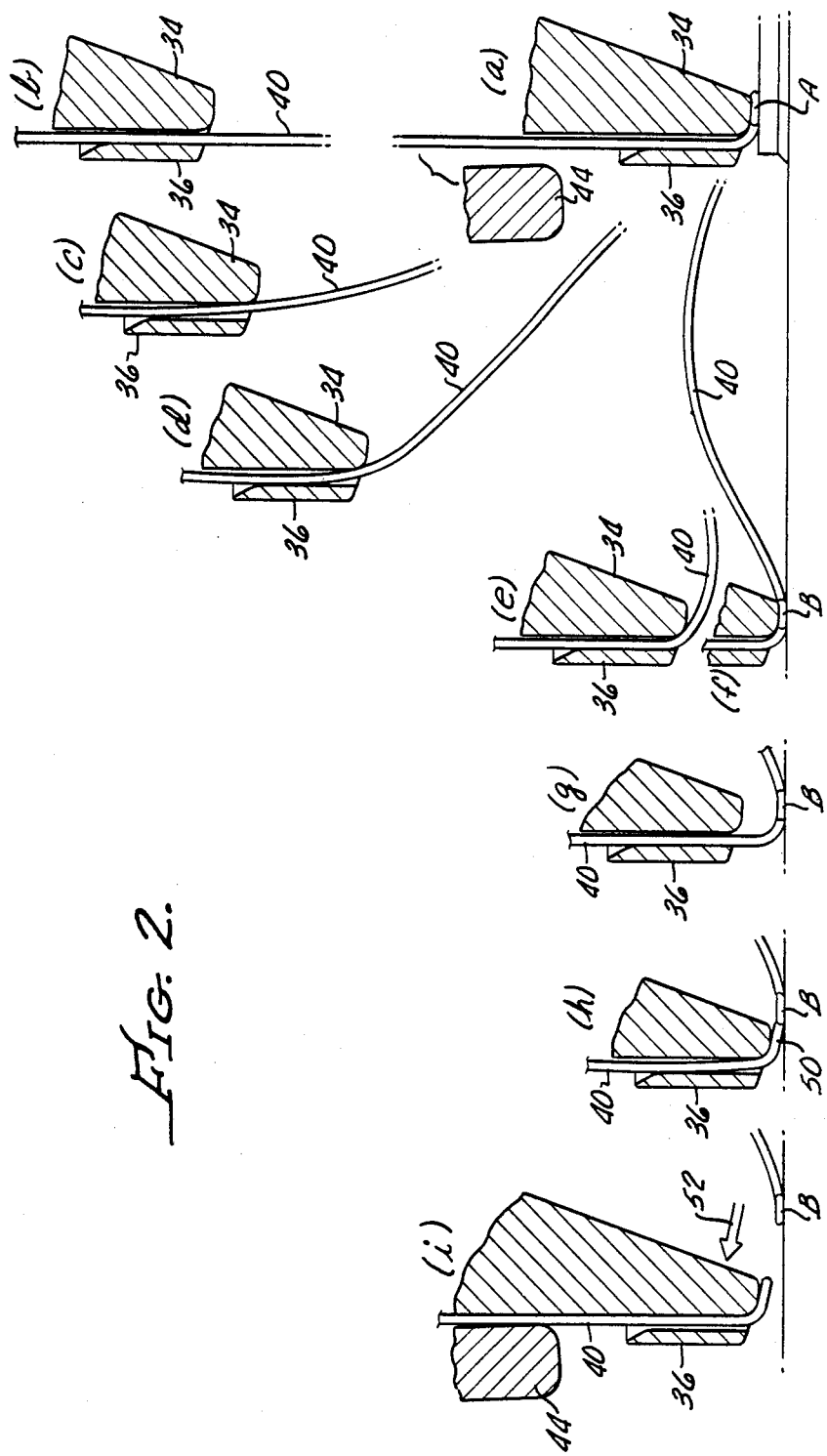

MISSING WIRE DETECTOR

BACKGROUND OF THE INVENTION

1. Field of the Invention

The present invention relates to wire bonders and more particularly concerns detection of a missing wire in a transducer driven bonder.

2. Description of Related Art

In many types of ultrasonic wire bonders wire is fed to and under the bonding tool which presses the wire downwardly against a circuit element to perform an ultrasonic bond at that point. Wire is paid out from a wire supply that is mounted to move with the tool by moving the tool and supply relative to the prior bond to which the wire is still secured. Then a second bond is made at a second point or circuit element, after which a length of fresh wire is paid out, by again moving the tool, to prepare for the next pair of bonds. The wire then is clamped to the tool, and by moving the tool, with the wire clamped thereto, relative to the bonds, the wire is broken at the last bond. The wire and tool are then moved to the location for the next bond. At times the wire may be improperly fed, may break between first and second bonds, or for some other reason the apparatus may fail to properly feed wire to and under the tip of the bonding tool, thereby preventing making of any subsequent bonds until the wire feed problem has been detected and corrected. In an automatic machine, the loss of wire may be undetected, and the machine may continue through its programmed operations without doing any useful work.

In the so-called ball bonder, which requires a ball on the leading edge of a wire for the first bond, a wire end ball is created by feeding a current through the wire, which is temporarily connected to portions of a wire end ball forming circuit. A missing wire is readily detected in such an arrangement by noting absence of current in the ball forming step. However, in many bonders, this ball forming step is not employed, and in such bonders there have been no known methods or arrangements for detecting a missing wire. Therefore, if wire is not properly fed in an automatic bonding machine, the apparatus may continue to operate, as previously mentioned, moving through its various positions, but all without any useful effect because there is no wire at the tip of the bonding tool.

Accordingly, it is an object of the present invention to provide for detection of a missing wire in a transducer driven wire bonder.

SUMMARY OF THE INVENTION

In carrying out principles of the present invention, in accordance with a presently preferred embodiment thereof, a missing wire of a transducer driven bonder is detected by monitoring force exerted on the wire during the relative motion of worktable and bond tool to break the wire. According to a specific feature of the invention, force exerted on the wire is effectively monitored by monitoring impedance of the transducer during the breaking step.

BRIEF DESCRIPTION OF THE DRAWINGS

In the accompanying drawings:

FIG. 2 shows the tip of the bonding tool and a wire in a number of successive positions in a sequence carried out during a bonding and wire breaking operation.

DESCRIPTION OF A PREFERRED EMBODIMENT

Figure 1:
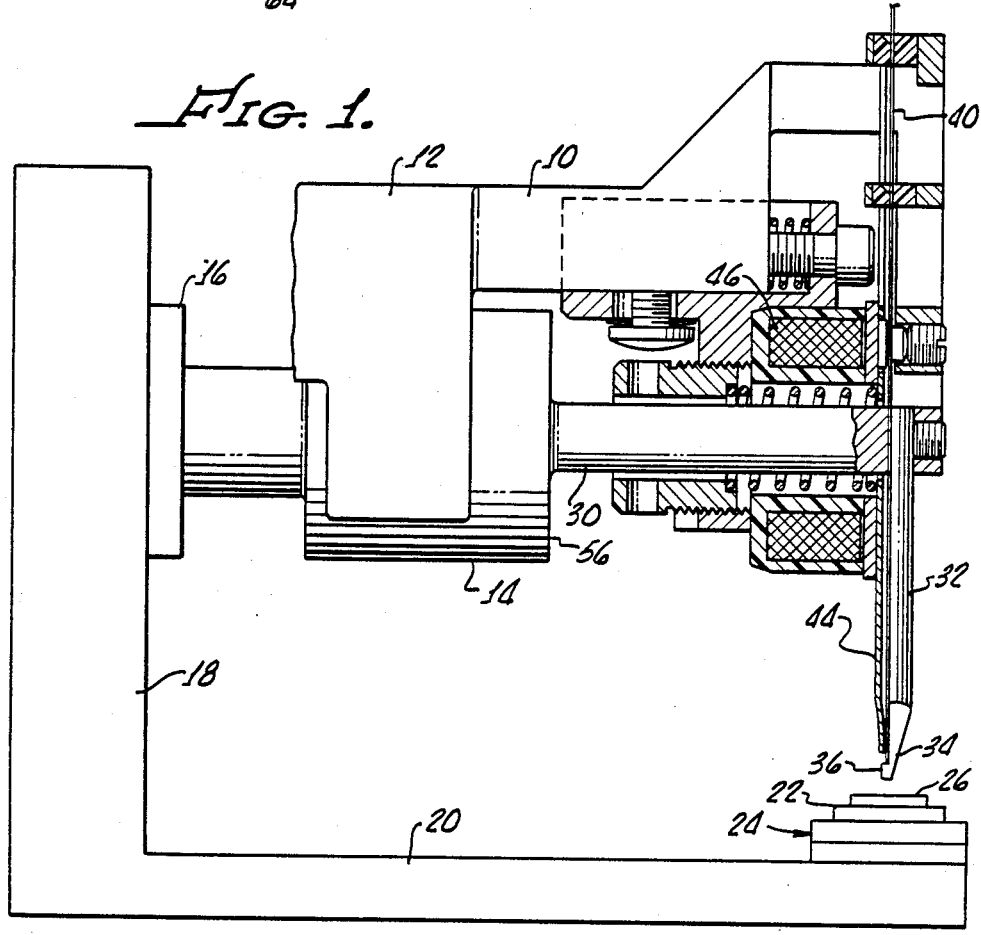
FIG. 1 is a simplified, partly schematic, illustration of an exemplary bonder and worktable.

Although principles of the present invention are applicable to many different types of bonders, these principles have been initially embodied in an ultrasonic wire bonder of which major functional components are illustrated in FIG. 1. Therefore principles of the invention are described herein as applied to such a bonder. A bonder frame 10 includes a transducer holding structure 12 which securely carries an ultrasonic transducer 14. The bonder frame is mounted by means of a vertical positioning apparatus, schematically illustrated at 16, to a fixed bonder support structure 18 having a forwardly extending table support 20 upon which is mounted a worktable 22 by means of a schematically depicted horizontal X,Y positioning apparatus 24. A workpiece in the form of a chip or the like 26, which carries electric circuit elements to which an electrically conductive wire is to be bonded, is securely carried by the worktable 22. The X,Y positioning apparatus 24 moves the worktable 22 and chip 26 horizontally under the bonder frame in two mutually orthogonal directions.

A transducer support arm 30 is fixed to and extends horizontally from one side of transducer 14 and fixedly carries a bonding tool in the form of a rigid, slender rod 32. The tool has a tapered tool tip 34 to which is affixed a wire guide element 36 through which a wire 40 may be guided to extend along the lower end of the tool and under the tool tip, as best seen in FIG. 2. The bonder frame 10 carries a wire supply spool (not shown) from which wire 40 is drawn to extend along a path that parallels the bonder tool 32. The wire extends vertically downwardly past a wire clamp 44 operated by a clamp solenoid 46 carried on the bonder frame. The clamp, when its solenoid is energized, securely presses the wire to the bonder frame structure and to the tool to prevent motion of the wire relative to the bonder frame structure and tool. When the clamp solenoid is not energized the wire is freely movable along its vertical path to and under the tip 34 of the bonder tool. Vertical positioning apparatus 16 enables the bonder frame, and the tool 32, to be moved up and down, vertically downwardly toward the table to form a bond and upwardly from the table to clear table mounted components during horizontal motion of the table.

FIG. 2 illustrates a typical sequence of bonder tool tip and wire positions with respect to a pair of points on circuit elements carried on the worktable. Bonds A and B, respectively, are to be made at spaced points on the circuit element. The successive positions attained by the bonder tool tip in performing and completing a pair of bonds A and B are illustrated as positions labeled (a) through (f). Subsequent positions and motion of the bonder tool tip that are accomplished for the feeding of fresh wire and the breaking of the wire at the last bond are illustrated at (g), (h) and (i).

With the wire 40 extending just under the tip 34 of the bonder tool and through the wire guide 36 on the tool tip, and with the table positioned horizontally under the tool, the tool is lowered vertically to position (a). The tool tip is pressed against the workpiece, with the wire 40 interposed therebetween, while the transducer is energized to perform the first bond A. Having completed the first bond, the bonding tool is raised vertically to position (b) by operation of vertical position control 16, and then the tool begins to move downwardly while the X,Y worktable positioning apparatus 24 concomitantly moves the worktable and the circuit elements horizontally, toward the right as illustrated in FIG. 2. This causes the wire and bonding tool tip to move to the left, as indicated in the figure, relative to the first bond. During these operations and motions, the clamp, schematically indicated in FIG. 2 by a section of clamp 44, is not activated so that the wire is freely movable relative to the bonding tool and through the wire guide 36. With the first bond A having been accomplished, and with the wire clamp deactivated, any subsequent motion of the bonding tool relative to the bond will pull additional wire from the wire supply spool so that, in effect, the bonding tool will move along the wire as more wire is paid out from the supply spool. The tool continues to move downwardly, as the worktable moves horizontally, through positions (c), (d) and (e). At (e) horizontal motion of the worktable is stopped and vertical motion of the bonding tool continues to position (f), where bond B is performed. Both bonds are made to the same or different circuit elements that are mounted to the worktable.

Having completed the second bond, it is necessary to provide fresh wire under the bond tip and to break the wire at the second bond. To this end, the wire bond tool is raised a short distance to (g), with the wire unclamped, to withdraw additional wire. The tool is then lowered while the table is moved forwardly (toward the right), as seen in FIG. 2, to bend the fresh wire under the tool tip, as illustrated in position (h). Thus fresh wire, designated at 50 in FIG. 2, position (h), has been withdrawn from the supply and positioned properly under the tip 34 of the tool. Now the wire is to be broken at the second bond. This is accomplished by first actuating the clamp, as indicated by the position of clamp 44 in position (i), raising the bonder tool slightly and moving the worktable slightly toward the right. This motion accomplishes a relative rearward or leftward motion of the tool and clamped wire, as indicated by arrow 52, and breaks the wire at the second bond B, leaving the newly formed end of the line properly positioned under the tool tip as shown in position (i).

If, at any time during the sequence of steps described above and illustrated in FIG. 2, the wire is not properly positioned, and/or appropriate bonds are not made, wire may become displaced from the lower end of the tool tip 34, resulting in a "lost" or "missing" wire. If the wire is lost, the very small motion of the breaking step, moving from position (h) to position (i), will exert little or no tensile force on the wire. If the wire has previously broken inadvertently, there may be no second bond nor any wire extending through guide 36 below the tool tip. If wire has become dislodged from its feed path under the tool tip, the very short motion from position (h) to position (i) may fail to apply any significant tension to the wire at all. In any event, if the wire is not positioned properly below the end of the tool tip during the wire breaking step, adequate tensile force cannot be applied and no breaking occurs.

According to principles of the present invention, the presence or absence of a properly positioned wire is determined by monitoring force exerted on the wire during the breaking step, which is the motion from position (h) to position (i). Force exerted on the wire is exerted by the lowermost end of the tool tip 34 and is exerted in a substantially horizontal direction on the tool tip, the force being directed axially along the wire to the last bond. Accordingly, this tensile force of the wire creates a force on the lower end of the tool tip directed normal to the tool axis. This exerts a bending moment on the tool 32, tending to bend and rotate the tool in a counter clockwise direction (as viewed in FIG. 1) about its fixed connection to the forward end of tool support arm 30 so that the latter, which is fixed to and cantilevered from the forward side 56 of transducer 14, exerts a physical stress on the transducer. The physical stress exerted on the transducer by the force applied via tool support arm 30 will change the transducer impedance. With the transducer energized at this time, this change in impedance is readily detected to signal occurrence of the proper wire breaking force. If there is a missing wire, so that the proper tensile breaking force is not exerted on the wire, this force is not transmitted to the transducer, which, therefore, does not experience the described change in impedance. Thus, lack of a change of impedance of the energized transducer during this breaking step signals that a wire is missing.

Figure 3:
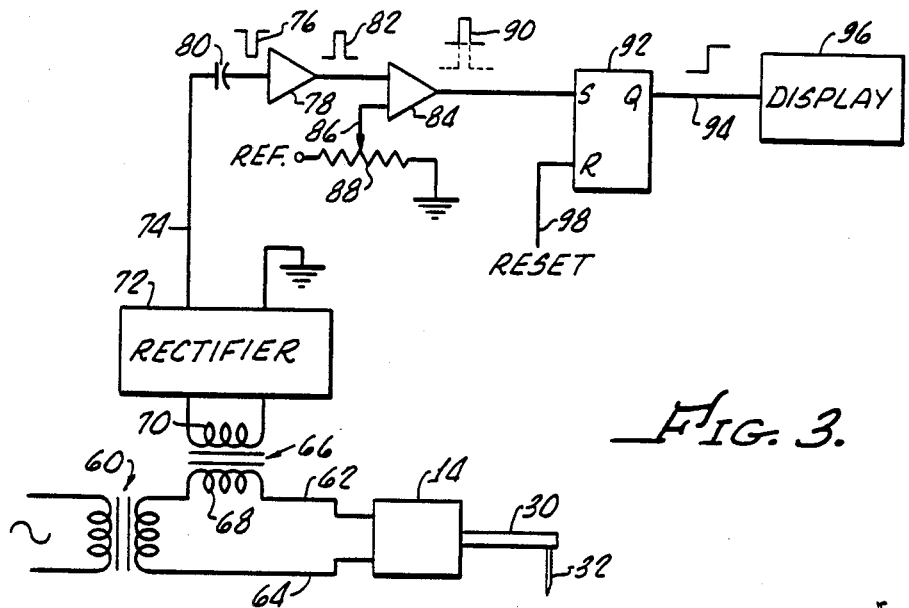
FIG. 3 shows a circuit for monitoring transducer impedance.

It will be readily appreciated that many different arrangements may be employed to monitor the force exerted on the wire or to monitor forces exerted on the bending tool or to monitor impedance of the transducer. At present, monitoring of the wire force by means of monitoring transducer impedance is preferred to other arrangements for directly or indirectly sensing forces experienced by the wire, the tool, or the tool support arm, or the bond itself. An exemplary circuit for monitoring transducer impedance is illustrated in FIG. 3, which schematically shows bonding tool 32, tool support arm 30, and transducer 14. The power source may be the source already present for energizing the transducer during its bonding operation. The transducer is energized with an alternating current via a transformer 60 connected to an AC power source (not shown) to feed energizing current through lines 62, 64 to the transducer. The transducer energizing current is sensed by a current detecting transformer 66 having a primary winding 68 connected in series in the transducer energizing current line 62 and having a secondary winding 70 connected to the input of a rectifier 72 which provides a rectified DC output signal on an output line 74 thereof.

In a normal wire breaking operation, the tensile breaking force exerted on the wire increases the transducer impedance and concomitantly decreases the transducer energizing current. This increase in impedance and decrease in current cease upon breaking of the wire when the forces exerted on the wire, tool and transducer cease. Thus, exertion of a proper breaking force causes the rectifier 72 to provide a negative going current pulse 76, which is coupled to an amplifier 78 by means of a capacitor 80. The pulse is inverted by amplifier 78, as indicated at pulse 82 and fed to one input of a comparator formed by a differential amplifier 84, having a second input from the arm 86 of a variable potentiometer 88 connected between ground and a source of reference potential. The potentiometer establishes a reference threshold for comparison with the pulse 82 fed to the input of comparison amplifier 84. If the input pulse 82 exceeds the reference input to the amplifier, the latter produces a positive going output pulse 90, which is fed to set a bistable circuit comprising a flip-flop 92, which in turn provides an output, when set, on a line 94 to a suitable visual display or audible alarm device 96. Upon completion of the breaking step, the transducer is reset by a signal applied from a suitable control circuit (not shown) on a flip-flop reset line 98.

If there is a missing wire, there is no variation in force as occurs on breaking of a wire, and concomitantly, no corresponding force is applied to the bonder tool or to the transducer. Therefore, neither the transducer impedance nor its energizing current will vary and no output is provided from the comparison amplifier 84. Flip-flop 92 remains reset and display or alarm 96 will signal the missing wire. Of course, if deemed necessary or desirable, the occurrence of a mising wire may also be employed to automatically stop operation of the bonder, while visually displaying the fault.

There have been described methods and apparatus for detecting a lost wire in a wire bonder by monitoring tensile force exerted on the wire during the steps carried out to break the wire at the last bond. Most conveniently the lost wire detection described herein employs the existing ultrasonic transducer of the bonder and its existing energizing circuitry, and merely senses energizing current and transducer impedance as an indicator of presence or absense of the wire during the breaking step.

What is claimed is:

1. For use in a wire bonder wherein a bonding tool is moved relative to the wire and away from a prior bond to feed fresh wire to the tool, and wherein the wire is then pulled to break it at said prior bond, a method of detecting lost wire comprising the steps of:
   moving the wire relative to the prior bond in a breaking step, thereby tending to exert a breaking force on the wire to break the wire, and
   detecting the loss of the wire by monitoring the force exerted on the wire during said breaking step.

2. The method of claim 1 including the step of clamping the wire to the bonding tool and moving the tool and wire relative to the prior bond during the breaking step whereby the breaking step tends to exert a force on said tool, and wherein said monitoring comprises monitoring the force exerted on said tool.

3. The method of claim 2 wherein the tool is driven by a transducer, wherein said breaking step tends to exert a force on said transducer, and wherein said last mentioned monitoring comprises energizing the transducer while the tool is moved in said breaking step, and monitoring the force exerted on said transducer.

4. The method of claim 3 wherein said last mentioned monitoring comprises detecting impedance of said transducer during said breaking step.

5. In a bonding system wherein a bonding tool is moved relative to a worktable carrying an element to which a wire is to be bonded by using the tool to press a wire against the element, wherein said wire is broken after completion of a bond by motion of the worktable and bond relative to the bonding tool to cause a wire breaking force to be exerted on and to break the wire, apparatus for detecting absence of wire at the bonding tool, said apparatus comprising:
   means for sensing said force exerted on said wire by motion of the worktable and bond relative to the bonding tool, and
   means for signaling a missing wire when the sensed force exerted on the wire is less than a selected amount.

6. The apparatus of claim 5 wherein said motion of the worktable and bond relative to the bonding tool causes the wire to exert a force on the bonding tool, and wherein said means for sensing force comprises means for monitoring force exerted upon the tool by the wire during said motion of the work table and bond relative to the bending tool to break the wire.

7. The apparatus of claim 5 wherein the bonding tool is driven by a transducer, wherein said motion of the worktable and bond relative to the bonding tool causes the wire and tool to exert a force on the transducer, and wherein said means for sensing force comprises means for monitoring force exerted by the wire and tool upon the transducer during the motion of the worktable and bond relative to the bonding tool to break the wire.

8. The apparatus of claim 5 wherein the bonding tool is driven by a transducer, and wherein said means for sensing force comprises means for energizing the transducer while the worktable and bond are moved relative to the bonding tool, and means for monitoring impedance of the transducer while it is so energized.

9. The apparatus of claim 5 wherein the bonding tool is connected to a transducer to transmit force between the tool and transducer, and wherein said means for sensing force comprises means for energizing the transducer with an energizing current while the worktable and bond are moved relative to the bonding tool to break the wire, and means for detecting a change in said energizing current due to application of a force to the transducer in response to motion of the worktable and bond relative to the bonding tool, thereby indicating loss of wire by the absence of a detected change in said current.

10. The apparatus of claim 5 wherein the bonding tool is driven by a transducer, and wherein said means for sensing force comprises energizing circuit means for applying an energizing current to the transducer while the worktable and bond are moved relative to the bonding tool, means for detecting a relatively sharp variation in said energizing current, and means responsive to said detecting means for indicating presence or loss of wire at the bonding tool.

11. The apparatus of claim 5 wherein the bonding tool is driven by a transducer, and wherein said means for sensing force comprises energizing circuit means for applying an energizing current to said transducer, pulse detector means for detecting variation in said energizing current, comparison means responsive to said pulse detector means for comparing variation in said energizing current with a reference, and means responsive to the comparison means for providing an indication of a missing wire.

12. An ultrasonic wire bonding system comprising:
   a worktable adapted to carry an element to which a wire is to be ultrasonically bonded,
   a bonder support,
   means for moving the bonder support relative to the worktable,
   a transducer mounted to the bonder support,
   a bonder tool mounted on the bonder support and connected to the transducer,
   means for energizing the transducer,
   clamp means on the bonder support for clamping to the support a wire that is to be bonded,
   said means for moving the bonder support relative to the worktable and transducer comprising means for moving the worktable and an element thereon relative to the bonder support while the wire is clamped, to thereby exert a wire breaking tensile force on a wire bonded to an element on the worktable and cause the wire to break, and means for detecting loss of wire comprising:
   means for detecting said tensile force, and
   means responsive to said detecting means for indicating a missing wire when the detected tensile force is below a selected minimum.

13. The apparatus of claim 12 wherein said means for indicating a missing wire comprises means for signaling absence of said tensile force during motion of said worktable relative to the bonder support.

14. The apparatus of claim 12 wherein said means for detecting said tensile force comprises means for applying an energizing electric signal to said transducer while the worktable and element thereon are moved relative to the bonder support, and means responsive to said energizing signal for monitoring impedance of the transducer.

15. The apparatus of claim 12 including means for applying an energizing alternating current to said transducer, a current sensor connected to said means for applying energizing current, a rectifier connected to said sensor for providing a rectified current, a comparator having a preselected threshold, having an input, and having an output indicative of the relation of its input to said threshold, means responsive to the rectifier for coupling a change in the rectified current to said comparator input, and a missing wire indicator connected to receive the output of the comparator.

16. The apparatus of claim 15 wherein said missing wire indicator comprises a bi-stable circuit connected to be set to a first stable condition upon receipt of an output signal from the comparator, and means for resetting the bi-stable circuit to a second stable condition.

* * * * *